United States Patent
Hoshida et al.

(10) Patent No.: US 7,060,784 B2
(45) Date of Patent: Jun. 13, 2006

(54) POLYIMIDE PRECURSOR RESIN SOLUTION COMPOSITION SHEET

(75) Inventors: Shigehiro Hoshida, Ibaraki-ken (JP); Masahiro Usuki, Ibaraki-ken (JP); Michio Aizawa, Ibaraki-ken (JP); Tadashi Amano, Ibaraki-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/874,715

(22) Filed: Jun. 24, 2004

(65) Prior Publication Data

US 2004/0265601 A1    Dec. 30, 2004

(30) Foreign Application Priority Data

Jun. 25, 2003    (JP) .............................. 2003-181289

(51) Int. Cl.
*C08G 73/10*    (2006.01)
*B32B 27/00*    (2006.01)
*B32B 27/06*    (2006.01)
*B32B 15/04*    (2006.01)

(52) U.S. Cl. ...................... 528/353; 528/170; 428/457; 428/458; 428/473.5; 428/220

(58) Field of Classification Search ................ 428/458, 428/457, 473.5, 220; 528/170, 353
See application file for complete search history.

(56) References Cited

U.S. PATENT DOCUMENTS

| 6,133,408 A | * | 10/2000 | Chiu et al. | ................... 528/353 |
| 6,852,828 B1 | * | 2/2005 | Scott | .......................... 528/314 |
| 2004/0105989 A1 | * | 6/2004 | Ohta et al. | ............... 428/473.5 |
| 2004/0265601 A1 | * | 12/2004 | Hoshida et al. | ............. 428/457 |

FOREIGN PATENT DOCUMENTS

| JP | 59-232455 A | 12/1984 |
| JP | 61-275325 A | 12/1986 |
| JP | 61-212140 A | 9/1987 |
| JP | 1-244841 A | 9/1989 |
| JP | 1-245586 A | 9/1989 |
| JP | 2-122697 A | 5/1990 |
| JP | 2-180679 A | 7/1990 |
| JP | 2-180682 A | 7/1990 |
| JP | 6-190967 A | 7/1994 |
| JP | 7-57540 A | 3/1995 |

* cited by examiner

*Primary Examiner*—P. Hampton Hightower
(74) *Attorney, Agent, or Firm*—Birch, Stewart, Kolasch & Birch, LLP

(57) ABSTRACT

A polyimide precursor resin solution composition sheet having a solvent content of 1–50% by weight and a thickness of 1–10 microns has improved adhesion, forms a heat resistant polyimide layer when cured, and is advantageously used in the bonding of conductors to plastic films.

7 Claims, No Drawings

POLYIMIDE PRECURSOR RESIN SOLUTION COMPOSITION SHEET

TECHNICAL FIELD

This invention relates to a polyimide precursor resin solution composition sheet having improved adhesion, ease of handling and heat resistance, for use in rigid and flexible printed boards utilized as electronic parts.

BACKGROUND ART

It is known in the art to manufacture flexible substrates by applying a polyimide precursor resin solution directly onto a conductor, followed by drying and curing, as disclosed, for example, in JP-A 59-232455, JP-A 61-275325, JP-A 62-212140, and JP-A 7-57540. Another method of applying a polyimide precursor resin solution in several divided portions onto a conductor is disclosed, for example, in JP-A 2-180682, JP-A 2-180679, JP-A 1-245586 and JP-A 2-122697.

However, the method of applying a polyimide precursor resin solution onto a conductor has the problem that unless the ultimate polyimide layer on the flexible substrate has a thickness of at least 20 microns, the substrate is awkward to handle because of the lack of so-called "body." This inevitably necessitates that the polyimide precursor resin be so thickly applied and cured to a conductor as to form an ultimate polyimide layer of at least 20 microns thick. Since it is thus difficult to apply to a uniform thickness, thickness variations frequently occur, resulting in faulty products. This indicates the tendency that when the solution is applied in several divided portions, thickness variations become exaggerated with an increasing number of divided portions.

It was then proposed to form a thermoplastic polyimide layer on a conductor before lamination as disclosed, for example, in JP-A 1-244841 and JP-A 6-190967. With this method, the thermoplastic polyimide layer is pressure bonded so that the thickness of the entire polyimide layer becomes uniform. In particular, in the process of applying a polyimide or polyamide acid solution, drying and curing to form a thermoplastic polyimide/metal foil laminate, and bonding a polyimide film to the thermoplastic polyimide side under heat and pressure, as taught in JP-A 6-190967, the thermoplastic polyimide is melted by heating so that the thickness is corrected. As a result, the entire polyimide layer after laminated with the polyimide film has a uniform thickness.

Nevertheless, this process is not economical because the once cured polyimide must be bonded under heat and pressure, which requires a special equipment capable of heating to a temperature above the glass transition temperature (Tg) of polyimide.

SUMMARY OF THE INVENTION

An object of the present invention is to provide a polyimide precursor resin solution composition sheet having improved adhesion, heat resistance as cured, and ease of handling so that it is suited for use in rigid and flexible printed boards.

The inventors have found that a polyimide precursor resin solution composition sheet is effective as a sheet to be interposed between a conductor and a plastic film for improving the adhesion therebetween, when the sheet has a solvent content of 1 to 50% by weight, preferably 3 to 10% by weight and a controlled uniform thickness, typically of 1 to 10 microns, preferably 2 to 5 microns, and more preferably has a glass transition temperature of at least 350° C. after imidization. The sheet has improved heat resistance and is easy to handle and can be processed without a need for special equipment.

DESCRIPTION OF THE PREFERRED EMBODIMENT

Throughout the specification and claims, all percents are by weight unless otherwise stated.

The polyimide precursor resin solution composition sheet of the invention has a solvent content of 1 to 50% by weight and a thickness of 1 to 10 microns (μm). It can be prepared, for example, by applying a polyimide precursor resin solution in planar form, then tailoring the applied composition by drying or otherwise processing during or after the applying step so that the composition may have a solvent content of 1 to 50%, preferably 3 to 10%, and further tailoring so that the composition may have a thickness of 1 to 10 microns, preferably 2 to 5 microns. In the sheet of the preferred embodiment, the polyimide precursor resin is selected such that the composition after imidization may have a glass transition temperature of at least 350° C.

The composition sheet of the invention must have a solvent content of at least 1%. If the solvent content is less than 1%, the sheet can be laminated only under special conditions including a high temperature of at least 200° C. and a high pressure of at least 50 kg/cm (linear pressure), which require a special equipment. When a sheet with a solvent content of less than 1% is laminated, irregularities are often observed in the laminated state. As long as the solvent content is in the range of 1% to 50%, the sheet can be laminated under moderate conditions including a low temperature of up to 200° C. and a low pressure of up to 50 kg/cm (linear pressure). Particularly when the solvent content is at least 3%, lamination is possible without irregularities. If the solvent content is more than 50%, the process becomes uneconomical because the withdrawal of so much solvent in the subsequent step is difficult. A solvent content of up to 10% is preferred because effective lamination is possible and the withdrawal of solvent in the subsequent step is easy and economical.

Also, the composition sheet of the invention must have a thickness of 1 to 10 microns. If the thickness is less than 1 micron, the sheet is too thin so that when a conductor and a film are laminated with it, the thickness is inconsistent. A thickness of more than 10 microns can cause difficult withdrawal of solvent in the subsequent step. A thickness of at least 2 microns is preferred because a consistent lamination strength is obtainable. A thickness of up to 5 microns is preferred for economy. The thickness may be adjusted either by applying a pressure to the sheet sandwiched between a conductor and a film or by coating on an ordinary plate such as a polyester plate in planar form and drying.

The polyimide precursor resin used herein may be a polyamic acid which is obtained by polymerizing an acid anhydride and a diamine in a suitable solvent.

The acid anhydrides used herein include tetracarboxylic acid anhydrides and derivatives thereof. It is noted that although examples of tetracarboxylic acid are described below, esters, anhydrides and chlorides of such acids can, of course, be employed. Illustrative examples of suitable tetracarboxylic acid include pyromellitic acid, 3,3',4,4'-biphenyltetracarboxylic acid, 3,3',4,4'-benzophenonetetracarboxylic acid, 3,3',4,4'-diphenylsulfonetetracarboxylic acid, 3,3',4,4'-diphenylethertetracarboxylic acid, 2,3,3',4'-benzophenonetetracarboxylic acid, 2,3,6,7-naphthalenetetracarboxylic acid, 1,2,5,6-naphthalenetetracarboxylic acid, 3,3',4,4'-diphenylmethanetetracarboxylic acid, 2,2-bis(3,4-dicarboxyphenyl)propane, 2,2-bis(3,4-dicarboxyphenyl) hexafluoropropane, 3,4,9,10-tetracarboxyperillene, 2,2-bis [4-(3,4-dicarboxyphenoxy)phenyl]propane, 2,2-bis[4-(3,4-dicarboxyphenoxy)phenyl]hexafluoropropane, butanetetracarboxylic acid, and cyclopentanetetracarboxylic acid. Also included are trimellitic acid and derivatives thereof.

It is also possible to introduce a crosslinked structure or ladder structure through modification with a compound having a reactive functional group.

Examples of the diamine used herein include p-phenylenediamine, m-phenylenediamine, 2'-methoxy-4,4'-diaminobenzanilide, 4,4'-diaminodiphenyl ether, diaminotoluene, 4,4'-diaminodiphenylmethane, 3,3'-dimethyl-4,4'-diaminodiphenylmethane, 3,3'-diethyl-4,4'-diaminodiphenylmethane, 2,2-bis[4-(4-aminophenoxy)phenyl]propane, 1,2-bis(anilino)ethane, diaminodiphenyl sulfone, diaminobenzanilide, diaminobenzoate, diaminodiphenyl sulfide, 2,2-bis(p-aminophenyl)propane, 2,2-bis(p-aminophenyl)hexafluoropropane, 1,5-diaminonaphthalene, diaminotoluene, diaminobenzotrifluoride, 1,4-bis(p-aminophenoxy)benzene, 4,4'-(p-aminophenoxy)biphenyl, diaminoanthraquinone, 4,4'-bis(3-aminophenoxyphenyl) diphenyl sulfone, 1,3-bis(anilino)hexafluoropropane, 1,4-bis (anilino)octafluoropropane, 1,5-bis(anilino)decafluoropropane, 1,7-bis(anilino)tetradecafluoropropane, 2,2-bis[4-(p-aminophenoxy)phenyl]hexafluoropropane, 2,2-bis[4-(3-aminophenoxy)phenyl]hexafluoropropane, 2,2-bis[4-(2-aminophenoxy)phenyl]hexafluoropropane, 2,2-bis[4-(4-aminophenoxy)-3,5-dimethylphenyl]hexafluoro-propane, 2,2-bis[4-(4-aminophenoxy)-3,5-ditrifluoromethylphenyl]-hexafluoropropane, p-bis(4-amino-2-trifluoromethylphenoxy)benzene, 4,4'-bis(4-amino-2-trifluoromethylphenoxy) biphenyl, 4,4'-bis(4-amino-3-trifluoromethylphenoxy) biphenyl, 4,4'-bis(4-amino-2-trifluoromethylphenoxy) diphenyl sulfone, 4,4'-bis(4-amino-5-trifluoromethylphenoxy)diphenyl sulfone, 2,2-bis[4-(4-amino-3-trifluoromethylphenoxy)phenyl]hexafluoropropane, benzidine, 3,3',5,5'-tetramethylbenzidine, octafluorobenzidine, 3,3'-methoxybenzidine, o-tolidine, m-tolidine, 2,2',5,5',6,6'-hexafluorotolidine, 4,4"-diaminoterphenyl, and 4,4'''-diaminoquarterphenyl. Also included are diisocyanates obtained through reaction of the foregoing diamines with phosgene or the like, and diaminosiloxanes.

Examples of the solvent used herein include N-methylpyrrolidone (NMP), dimethylformamide (DMF), dimethylacetamide (DMAc), dimethyl sulfoxide (DMSO), dimethyl sulfate, sulfolane, butyrolactone, cresol, phenol, halogenated phenols, cyclohexanone, dioxane, tetrahydrofuran and diglyme.

The reaction may be effected under conditions including a temperature of 10 to 40° C., a reaction solution concentration of up to 30% by weight, a molar ratio of tetracarboxylic anhydride/diamine between 0.95:1.00 and 1.05:1.00, and a $N_2$ atmosphere although the reaction conditions are not limited thereto.

In the practice of the invention, a copolymer using the above compounds and the like or a blend of polyimide precursors can also be used. Also inorganic, organic or metallic substances in powder or fiber form may be used in combination for the purpose of improving some properties. There can further be added additives such as antioxidants for the purpose of preventing conductors from oxidation or silane coupling agents for the purpose of improving adhesion. It is further possible to blend different polymers for the purpose of improving adhesion or the like.

While the polyimide precursor used herein is obtained through reaction of the aforementioned compounds, use of a polyimide precursor which after imidization will have a glass transition temperature (Tg) of at least 350° C., more preferably 350 to 500° C. is preferred. Since higher heat resistance is achieved after imidization and the service temperature range of finished products is significantly expanded toward the high temperature side, such a polyimide precursor is more effective in the application where resistance to soldering heat at elevated temperatures is required. If the Tg is lower than 350° C., finished products have lower heat resistance so that the range of applicable products is reduced.

The composition sheet of the invention can be used in the bonding of a conductor and a plastic film. Examples of the conductor used herein include copper, iron, molybdenum, zinc, tungsten, nickel, chromium, aluminum, silver and alloys thereof, such as stainless steel. Most preferred is copper which is frequently used as an electronic material in rigid and flexible printed boards.

The conductor may be surface treated, for example, by metal plating, surface oxidation or physical indentation. Further, the conductor may be treated with coupling agents such as aminosilanes, epoxysilanes and mercaptosilanes.

Examples of the plastic film used herein include polyimides, polyesters, polyamides, polyethylene, polyvinyl chloride, polypropylene, polyvinylidene chloride and polycarbonate. Because of heat resistance, polyimides are most useful as an electronic material.

The composition sheet of the invention is best suited for bonding in forming copper/insulating film laminates which are required to have a soldering heat resistance at a temperature of at least 350° C.

EXAMPLE

Examples and Comparative Examples are given below by way of illustration of the invention although the invention is not limited thereto. Percents are by weight. The abbreviations used have the following meanings.

PMDA: pyromellitic dianhydride
BPDA: biphenyltetracarboxylic dianhydride
ODA: oxydianiline
PPD: p-phenylenediamine Example 1

295 g of BPDA was dissolved in 10 kg of dimethylacetamide (DMAc), which was cooled at 10° C. 201 g of ODA was slowly added to the solution for reaction, obtaining a polyimide precursor resin solution composition.

The composition was coated onto a polyester film to a buildup of 50 microns and heated at 50° C. for 10 minutes by means of an explosion-proof dryer. The resulting sheet was stripped from the polyester film and analyzed to find a solvent content of 8% and a thickness of 10 microns.

The composition sheet was sandwiched between a rolled copper foil of 35 microns thick and a polyimide film of 25 microns thick (trade name Kapton, E.I. Dupont) and joined at a temperature of 150° C. and a linear pressure of 10 kg/cm by means of a roll laminating machine (Nishimura Kouki K.K.). The laminated state was observed.

The laminate was treated at 50° C. and 20 Pa for 5 hours in a vacuum oven and then heated at 350° C. for 5 hours for imidization.

The soldering heat resistance of the finished laminate and the Tg of the composition layer were determined.

Example 2

220 g of PMDA was dissolved in 10 kg of dimethylacetamide (DMAc), which was cooled at 10° C. 110 g of PPD was slowly added to the solution for reaction, obtaining a polyimide precursor resin solution composition.

The composition was coated onto a polyimide film (trade name Kapton, E.I. Dupont) to a buildup of 10 microns and heated at 50° C. for 6 minutes by means of an explosion-proof dryer. The composition lying on the polyimide film was analyzed to find a solvent content of 3% and a thickness of 3 microns (after the thickness of the polyimide film was subtracted).

A rolled copper foil of 35 microns thick was laid on the surface of the composition so that the composition layer was sandwiched between the foil and the polyimide film. The assembly was joined at a temperature of 150° C. and a linear pressure of 10 kg/cm by means of a roll laminating machine (Nishimura Kouki K.K.). The laminated state was observed.

The laminate was treated at 50° C. and 20 Pa for 5 hours in a vacuum oven and then heated at 350° C. for 5 hours for imidization.

The soldering heat resistance of the finished laminate and the Tg of the composition layer were determined.

Examples 3–6

The procedure of Example 2 was repeated except that the buildup and the drying time of the composition were tailored so as to give a thickness and a solvent content after drying as shown in Table 1.

Comparative Examples 1–3

The procedure of Example 2 was repeated except that the buildup and the drying time of the composition were tailored so as to give a thickness and a solvent content after drying as shown in Table 1.

Comparative Example 4

There was furnished a polyimide film coated with thermoplastic polyimide on both surfaces (trade name Pixio, Kaneka Corp., thermoplastic polyimide coated having a Tg of 245° C.). It was laminated with a copper foil on one surface and a polyimide film on the other surface at a temperature of 380° C. and a linear pressure of 100 kg/cm.

The soldering heat resistance of the finished laminate was determined.

Observation of Laminated State

Using a defect detection unit (Futec Co., Ltd.), the number of bubbles between the copper foil and the film was counted. A more number of bubbles indicate irregular lamination. Rating was based on the criterion:

flat: not more than 2 bubbles/m$^2$
irregular: more than 2 bubbles/m$^2$

Measurement of Soldering Heat Resistance

A laminate specimen (25 mm long, 25 mm wide) was immersed in a solder bath at 350° C. for 30 seconds, after which the specimen was observed for peeling or blisters. Rating was based on the criterion:

Soldering Heat Resistance
≧350° C.: no peel nor blister
<350° C.: peeled or blisters

Measurement of Tq

The polyimide precursor resin solution composition obtained in each of Examples 1 and 2 was coated onto a glass plate, dried at 50° C. for 30 minutes for removing the solvent, and stripped from the glass plate, obtaining a sheet sample of the polyimide precursor resin solution composition having a thickness of 3 mm. The sheet sample was heated at 350° C. for 5 hours for imidization. The imidized sample was tested on a thermal analyzer Model RSA-III (Rheometric Science) to determine whether or not its Tg was above 350° C.

TABLE 1

| | Thickness as dried (μm) | Solvent content as dried (%) | Lamination state | Soldering heat resistance | Tg |
|---|---|---|---|---|---|
| Example 1 | 10 | 8 | flat | ≧350° C. | ≧350° C. |
| Example 2 | 3 | 3 | flat | ≧350° C. | ≧350° C. |
| Example 3 | 1 | 5 | flat | ≧350° C. | ≧350° C. |
| Example 4 | 6 | 48 | flat | ≧350° C. | ≧350° C. |
| Example 5 | 5 | 22 | flat | ≧350° C. | ≧350° C. |
| Example 6 | 2 | 10 | flat | ≧350° C. | ≧350° C. |
| Comparative Example 1 | 0.5 | 4 | irregular | ≧350° C. | ≧350° C. |
| Comparative Example 2 | 3 | 0.4 | irregular | ≧350° C. | ≧350° C. |
| Comparative Example 3 | 5 | 0.7 | irregular | ≧350° C. | ≧350° C. |
| Comparative Example 4 | — | — | flat | <350° C. | <350° C. |

The polyimide precursor resin solution composition sheet of the invention has improved adhesion, forms a fully. heat resistant polyimide layer when cured, and is advantageously used in the bonding of conductors to plastic films.

Japanese Patent Application No. 2003-181289 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polyimide precursor resin solution composition sheet having a solvent content of 3 to 10% by weight and a thickness of 2 to 5 microns, wherein said sheet is interposed between a polyimide film and a copper foil, and wherein said polyimide precursor resin solution comprises biphenyltetracarboxylic dianhydride or pyromellitic dianhydride and oxydianiline or p-phenylenediamine and the solvent consists essentially of dimethylacetamide.

2. A method of bonding a conductor to a plastic film comprising the steps of:
   interposing a polyimide precursor resin solution composition sheet having a solvent content of 3 to 10% by weight and having a thickness of 1 to 10 microns between the conductor and the plastic film, and subsequently
   imidizing the polyimide precursor resin to obtain a polyimide layer having a glass transition temperature of at least 350° C.

3. The method of claim 2, wherein the conductor is a copper foil and the plastic film is a polyimide film.

4. The method of claim 2, wherein the sheet has a thickness of 2 to 5 microns.

5. The method of claim 2, wherein the polyimide precursor resin is produced from biphenyltetracarboxylic dianhydride and oxydianiline.

6. The method of claim 2, wherein the polyimide precursor resin is produced from pyromellitic dianhydride and p-phenylenediamine.

7. The method of claim 2, wherein the solvent consists essentially of dimethylacetamide.

* * * * *